US007679442B2

(12) United States Patent
Gerstenhaber et al.

(10) Patent No.: US 7,679,442 B2
(45) Date of Patent: Mar. 16, 2010

(54) OUTPUT DISTORTION CANCELLATION CIRCUIT

(75) Inventors: Moshe Gerstenhaber, Newton, MA (US); James Bundock, Pelham, NH (US)

(73) Assignee: Analog Devices, Inc., Norwood, MA (US)

( * ) Notice: Subject to any disclaimer, the term of this patent is extended or adjusted under 35 U.S.C. 154(b) by 29 days.

(21) Appl. No.: 12/103,153

(22) Filed: Apr. 15, 2008

(65) Prior Publication Data

US 2009/0256634 A1 Oct. 15, 2009

(51) Int. Cl.
*H03F 3/45* (2006.01)
(52) U.S. Cl. ...................................................... 330/252
(58) Field of Classification Search .......... 330/252–261
See application file for complete search history.

(56) References Cited

U.S. PATENT DOCUMENTS 5,150,074 A * 9/1992 Gosser ........................ 330/263

* cited by examiner

*Primary Examiner*—Robert Pascal
*Assistant Examiner*—Hieu P Nguyen
(74) *Attorney, Agent, or Firm*—Kenyon & Kenyon LLP

(57) ABSTRACT

An output distortion circuit includes a first transistor arrangement receiving a nonlinear current associated with a nonlinear differential error signal. The first transistor arrangement produces a reflected base current that is applied to one side of a differential input pair. A second transistor arrangement eliminates the nonlinear differential error signal by producing a replicated base current that replicates the reflected base current. The replicated base current is applied to an opposite side of the differential input pair thus the output distortion cancellation circuit creating a deflection of approximately equal magnitude to the reflected base current so as to eliminate the nonlinear differential error signal.

13 Claims, 1 Drawing Sheet

OUTPUT DISTORTION CANCELLATION CIRCUIT

BACKGROUND OF THE INVENTION

The invention relates to the field of amplifiers, and in particular to differential amplifiers removing output distortions.

Differential amplifiers are commonly employed as key components in many integrated circuits. However, the usefulness of differential amplifiers in many instrumentation type applications is often limited by non-linearities in their gain characteristics. These non-linearities also limit the dynamic range of input signal voltage magnitudes over which the amplifiers can be employed.

The linear dynamic range of a differential amplifier can be extended through the use of "emitter-degeneration". In accordance with this approach, the amplifier is provided with a pair of constant-current sources separately connected to the emitters of the transistors of the amplifier and further an "emitter feedback" resistor is connected between the emitters of these transistors. This type of circuitry reduces non-linearities in the gain of a differential amplifier but only to a limited extent.

SUMMARY OF THE INVENTION

According to one aspect of the invention, there is provided an output distortion cancellation circuit. The output distortion cancellation circuit includes a first transistor arrangement receiving a nonlinear current associated with a nonlinear differential error signal. The first transistor arrangement produces a reflected base current that is applied to one side of a differential input pair. A second transistor arrangement eliminates the nonlinear differential error signal by producing a replicated base current that replicates the reflected base current. The replicated base current is applied to an opposite side of the differential input pair thus the output distortion cancellation circuit creating a deflection of approximately equal magnitude to the reflected base current so as to eliminate the nonlinear differential error signal.

According another aspect of the invention, there is provided a method of removing nonlinear differential errors from an amplifier. The method includes receiving a nonlinear current associated with a nonlinear differential error signal. Also, the method includes producing a reflected base current that is applied to one side of a differential input pair. The nonlinear differential error signal is eliminated by producing a replicated base current that replicates the reflected base current. Furthermore, the method includes applying the replicated base current to an opposite side of the differential input pair thus creating a deflection of approximately equal magnitude to the reflected base current so as to eliminate the nonlinear differential error signal.

DETAILED DESCRIPTION OF THE INVENTION

Figure 1:
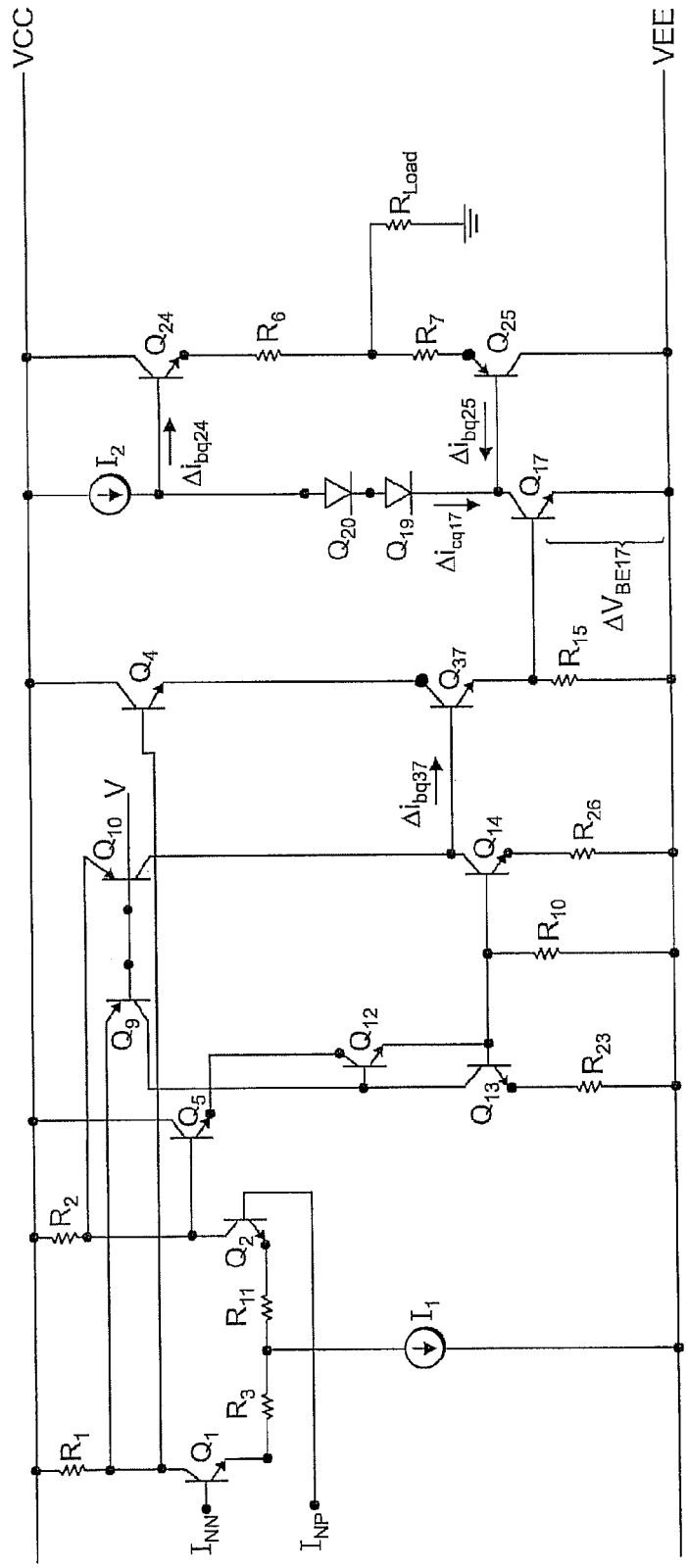
FIG. 1 is a circuit diagram illustrating the inventive output distortion cancellation circuit.

The invention describes a novel technique of eliminating nonlinear differential error. For linear signals at the input of an amplifier, a linear output response is desired. Some non-linearities are reflected back to the input as a function of a signal change at the output. The invention attempts to eliminate such nonlinearities.

FIG. 1 show a circuit diagram illustrating the inventive output distortion cancellation circuit 2. The output distortion cancellation circuit 2 includes a voltage source VCC. Resistors R1 and R2 are coupled to the voltage source VCC. The base of bipolar transistor Q1 is coupled to the voltage source INN, and the collector of the bipolar transistor Q1 is coupled to the resistor R1. The emitter of bipolar transistor Q1 is coupled to resistor R3, which also coupled to a resistor R11 and current source I1. The current source I1 is also coupled to VEE. The collector of bipolar transistor Q2 and the base of bipolar transistor Q5 are coupled to resistor R2. The emitter of bipolar transistor Q2 is coupled to the resistor R11 and the base of bipolar transistor Q2 is coupled to voltage source INP.

The collector of bipolar transistor Q5 is coupled to the voltage source VCC. The emitter of bipolar transistor Q5 is coupled to the collector of bipolar transistor Q12. The emitter of pnp bipolar transistor Q9 is coupled to the collector of bipolar transistor Q1, and the collector of bipolar transistor Q9 is coupled to the base of bipolar transistor Q12 and the collector of bipolar transistor Q13. The base of bipolar transistor Q9 is coupled to a voltage source V and the base of bipolar transistor Q10. The emitter of bipolar transistor Q12 is coupled to the bases of bipolar transistors Q13 and Q14. The emitter of bipolar transistor Q13 is coupled to a resistor R23. A resistor R10 is coupled to bases of bipolar transistors Q13 and Q14 and to VEE. The emitter of bipolar transistor Q14 is coupled to resistor R26. Both resistors R23 and R26 are also coupled to VEE.

The emitter of a pnp bipolar transistor Q10 is coupled to resistor R2. The collector of bipolar transistor Q10 is coupled to the collector of bipolar transistor Q14. The collector of bipolar transistor Q4 is coupled to the voltage source VCC, and the base of bipolar transistor Q4 is coupled to the resistor R1. The emitter of bipolar transistor Q4 is coupled to the collector of bipolar transistor Q37. The base of bipolar transistor Q37 is coupled to the collector of bipolar transistor Q14, and the emitter of bipolar transistor Q37 is coupled to a resistor R15, which is also coupled to VEE.

A current source I2 is coupled to the anode of diode Q20 and the cathode of Q20 is also coupled to the anode of diode Q19. The collector of bipolar transistor Q17 is coupled to the cathode of diode Q19. The base of bipolar transistor Q17 is coupled to the resistor R15. The emitter of bipolar transistor Q17 is coupled to VEE. The collector of bipolar transistor Q24 is coupled to the voltage source VCC, and the base of bipolar transistor Q24 is coupled to current source I2. The emitter of bipolar transistor Q24 is coupled to resistor R6. The resistor R7 is coupled to resistor R6 and the emitter of pnp bipolar transistor Q25. The base of bipolar transistor Q25 is coupled to the collector of bipolar transistor Q17, and the collector of bipolar transistor Q25 is coupled to VEE. A resistor Rload, used to represent output devices, is coupled to both resistors R6 and R7 and ground.

Note for a positive output the bipolar transistor Q24 provides a change in the base current ($\Delta i_{b_{q24}}$) that does not match the change in the base current ($\Delta i_{b_{q25}}$) of the bipolar transistor Q25 for a swing of the same magnitude in the negative direction. This nonlinearity change of current, together with a changing current of the current source I2 develops a nonlinear collector current ($\Delta i_{c_{q17}}$) through the bipolar transistor Q17. The ensuing voltage change between the base and emitter ($\Delta V_{BE17}$) of the bipolar transistor Q17 across resistor R15 results in a nonlinear current through bipolar transistor Q37, which adds to the non-linear base current of bipolar transistor Q17. That error is reflected to one side of the differential input pair as a base current of the bipolar transistor Q37.

Whatever the source of the nonlinear current, it is reflected by the base current ($\Delta i_{bq37}$) of the bipolar transistor Q37. To eliminate the nonlinear differential error, the base current ($\Delta i_{bq37}$) of the bipolar transistor Q37 is replicated by the bipolar transistor Q4 and fed to the opposite differential pair collector, thus creating a common mode error signal that can be easily rejected by the differential pair, out of an otherwise single current error that would cause a non-linear signal at the input of the amplifier. The circuit is particularly effective in reducing nonlinearities that grow larger with heavier loading since the base currents of the output devices increase as a function of load represented by the resistor Rload.

Although the present invention has been shown and described with respect to several preferred embodiments thereof, various changes, omissions and additions to the form and detail thereof, may be made therein, without departing from the spirit and scope of the invention.

The invention claimed is:

1. An output distortion cancellation circuit comprising:
   a first transistor arrangement receiving a nonlinear current associated with a nonlinear differential error signal, said first transistor arrangement produces a reflected base current that is applied to one side of a differential input pair; and
   a second transistor arrangement eliminating said nonlinear differential error signal by producing a replicated base current that replicates said reflected base current, said replicated base current is applied to an opposite side of said differential input pair, thus said output distortion cancellation circuit creating a deflection of approximately equal magnitude to said reflected base current so as to eliminate said nonlinear differential error signal.

2. The output distortion cancellation circuit of claim 1, wherein said one side of said differential input pair comprises a first bipolar transistor coupled to a first resistor.

3. The output distortion cancellation circuit of claim 2, wherein said first resistor is coupled to a current source.

4. The output distortion cancellation circuit of claim 3, wherein said opposite side of said differential input pair comprises a second bipolar transistor coupled to a second resistor.

5. The output distortion cancellation circuit of claim 4, wherein said second resistor is coupled to said current source.

6. The output distortion cancellation circuit of claim 1, wherein said second transistor arrangement is coupled the collector of said first transistor arrangement.

7. The output distortion cancellation circuit of claim 1, wherein said first transistor arrangement is coupled to a resistor.

8. The output distortion cancellation circuit of claim 4, wherein said second transistor arrangement is coupled to the collector of said second bipolar transistor.

9. A method of removing nonlinear differential errors from an amplifier comprising:
   receiving a nonlinear current associated with a nonlinear differential error signal,
   producing a reflected base current that is applied to one side of a differential input pair;
   eliminating said nonlinear differential error signal by producing a replicated base current that replicates said reflected base current, and
   applying said replicated base current to an opposite side of said differential input pair thus creating a deflection of approximately equal magnitude to said reflected base current so as to eliminate said nonlinear differential error signal.

10. The method of claim 9, wherein said one side of said differential input pair comprises a first bipolar transistor coupled to a first resistor.

11. The amplifier circuit of claim 10, wherein said first resistor is coupled to a current source.

12. The method of claim 11, wherein said opposite side of said differential input pair comprises a second bipolar transistor coupled to a second resistor.

13. The method of claim 12, wherein said second resistor is coupled to said current source.

* * * * *